United States Patent
Komine

(10) Patent No.: US 9,104,115 B2
(45) Date of Patent: Aug. 11, 2015

(54) METHOD FOR CONTROLLING EXPOSURE APPARATUS AND EXPOSURE APPARATUS

(71) Applicant: KABUSHIKI KAISHA TOSHIBA, Minato-ku, Tokyo (JP)

(72) Inventor: Nobuhiro Komine, Mie-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 232 days.

(21) Appl. No.: 13/778,645

(22) Filed: Feb. 27, 2013

(65) Prior Publication Data
US 2014/0063479 A1 Mar. 6, 2014

(30) Foreign Application Priority Data
Aug. 28, 2012 (JP) ................... 2012-187999

(51) Int. Cl.
*G03F 7/20* (2006.01)

(52) U.S. Cl.
CPC ........ *G03F 7/70133* (2013.01); *G03F 7/70066* (2013.01); *G03F 7/70558* (2013.01)

(58) Field of Classification Search
CPC ............ G03F 7/70133; G03F 7/70558; G03F 7/70066
USPC ....................................... 355/67, 77
See application file for complete search history.

(56) References Cited

U.S. PATENT DOCUMENTS

| 5,739,898 A * | 4/1998 | Ozawa et al. .................. 355/53 |
| 7,030,966 B2 | 4/2006 | Hansen |
| 2007/0132978 A1 | 6/2007 | Kawashima |
| 2011/0065027 A1 | 3/2011 | Inanami et al. |
| 2011/0122281 A1* | 5/2011 | Ohara et al. .............. 348/222.1 |

FOREIGN PATENT DOCUMENTS

| JP | 2011-066079 A | 3/2011 |
| JP | 2011-146449 A | 7/2011 |
| JP | 2011-187597 A | 9/2011 |

* cited by examiner

*Primary Examiner* — Steven H Whitesell Gordon
(74) *Attorney, Agent, or Firm* — Posz Law Group, PLC

(57) ABSTRACT

According to one embodiment, a method for controlling an exposure apparatus includes calculating a shift from a target value of an illuminance distribution on a reticle of light irradiated onto the reticle. The calculating is based on a relational expression and a measured value of an illuminance distribution on a wafer of light irradiated onto the wafer via a projection optical system. The relational expression has a correlation between the illuminance distribution on the reticle, the illuminance distribution on the wafer, and a spread function reflecting a characteristic of the projection optical system projecting light obtained by way of the reticle onto the wafer.

18 Claims, 10 Drawing Sheets

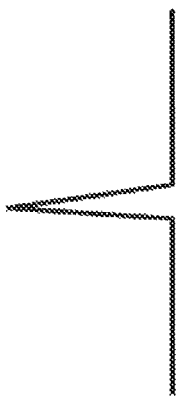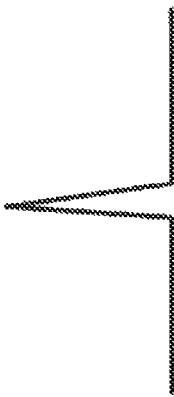

METHOD FOR CONTROLLING EXPOSURE APPARATUS AND EXPOSURE APPARATUS

CROSS-REFERENCE TO RELATED APPLICATION

This application is based upon and claims the benefit of priority from Japanese Patent Application No. 2012-187999, filed on Aug. 28, 2012; the entire contents of which are incorporated herein by reference.

FIELD

Embodiments described herein relate generally to a method for controlling an exposure apparatus and an exposure apparatus.

BACKGROUND

As patterns that are formed in semiconductor devices are downscaled, the wavelength of the exposure light is becoming shorter; and the practical use of EUV exposure which utilizes extreme ultraviolet (EUV) light of a wavelength of 13.5 nm is needed even more.

Because EUV light has a short wavelength and a reflective optical system is used as the projection optical system toward the wafer, stray light (flare) easily occurs in EUV exposure due to the scattered light caused by the unevenness of the mirror surfaces of the reflective optical system.

BRIEF DESCRIPTION OF THE DRAWINGS

FIG. 9A to FIG. 9E are schematic views showing another method for calculating the illuminance distribution on the reticle in the method for controlling the exposure apparatus according to the second embodiment;

DETAILED DESCRIPTION

According to one embodiment, a method for controlling an exposure apparatus includes calculating a shift from a target value of an illuminance distribution on a reticle of light irradiated onto the reticle. The calculating is based on a relational expression and a measured value of an illuminance distribution on a wafer of light irradiated onto the wafer via a projection optical system. The relational expression has a correlation between the illuminance distribution on the reticle, the illuminance distribution on the wafer, and a spread function reflecting a characteristic of the projection optical system projecting light obtained by way of the reticle onto the wafer.

The absorption coefficient of EUV light for the various substances currently used as optical members is larger than for deep ultraviolet (DUV) light such as KrF light and ArF light. Therefore, it is difficult for the projection optical system between the reticle and the wafer to use a refractive optical system that uses a transmissive lens. Accordingly, the projection optical system for EUV exposure includes a reflective optical system that uses mirrors.

Figure 10:
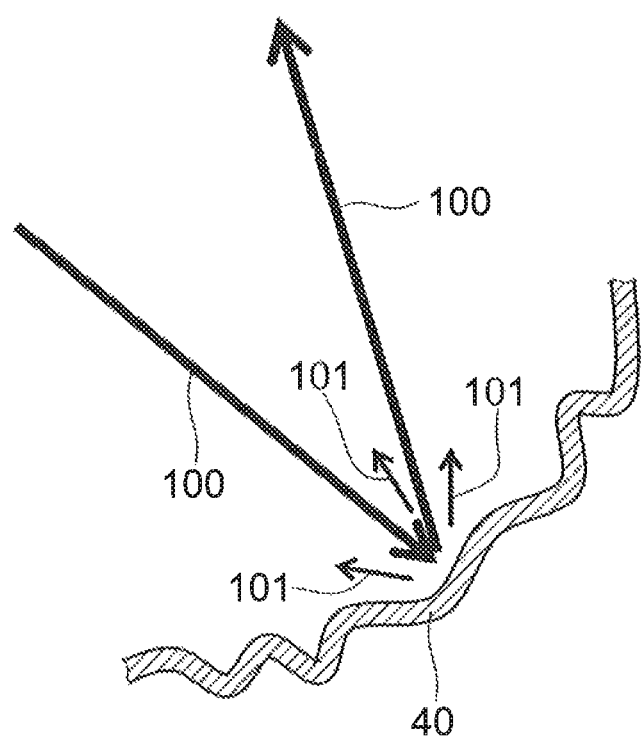
FIG. 10 is a schematic view showing scattering of light in a surface of a mirror of a reflective optical system.

One problem of such a reflective optical system is the flare (the stray light) due to scattered light 101 caused by the micro unevenness of the reflective surface of a mirror 40 as shown in FIG. 10. It is known that the effect of the flare increases as the wavelength of the exposure light shortens; and the effect of the flare cannot be ignored for EUV exposure using EUV light 100 of a wavelength of 13.5 nm, as compared with ArF light (a wavelength of 193 nm) and KrF light (245 nm).

For example, the adjustment of the illuminance distribution is affected by the flare. In an exposure apparatus that uses a refractive optical system, adjustments can be made to make the illuminance distribution on the wafer uniform by modifying the configuration of an exposure slit that passes light toward the reticle and inserting a filter in which the shading is changed in the optical path based on the illuminance distribution measured on the wafer stage. For an exposure apparatus in which the effect of the flare is small, the illuminance distribution on the reticle can be adjusted to be uniform by performing adjustments to make the illuminance distribution on the wafer uniform.

Figure 11A:
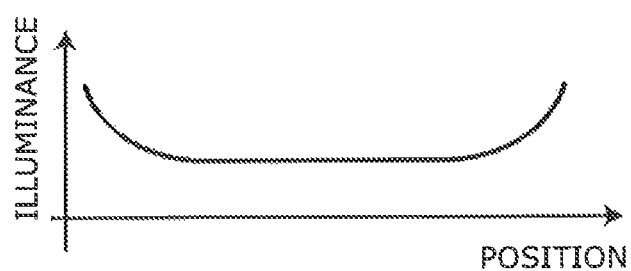
FIG. 11A is a chart showing an illuminance distribution on the reticle according to a comparative example.
Figure 11B:
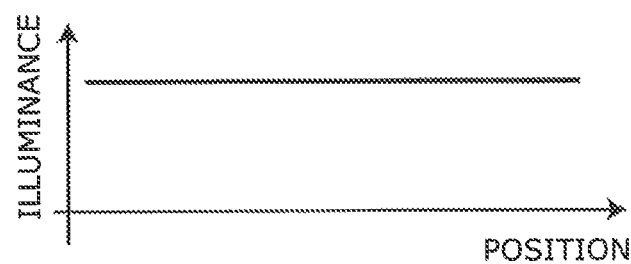
FIG. 11B is a chart showing an illuminance distribution on the wafer according to the comparative example.

However, in an EUV exposure apparatus, the effect of the flare occurring due to the mirrors included in the reflective optical system is undesirably included in the measurement result of the illuminance distribution on the wafer because the effect of the flare is large. Accordingly, even in the case where the illuminance distribution on the wafer is adjusted to be uniform as shown in FIG. 11B without considering the effect of the flare, there are cases where the illuminance distribution on the reticle surface is not adjusted to be uniform as shown in FIG. 11A.

Embodiments will now be described with reference to the drawings. Similar components in the drawings are marked with like reference numerals.

Figure 1:
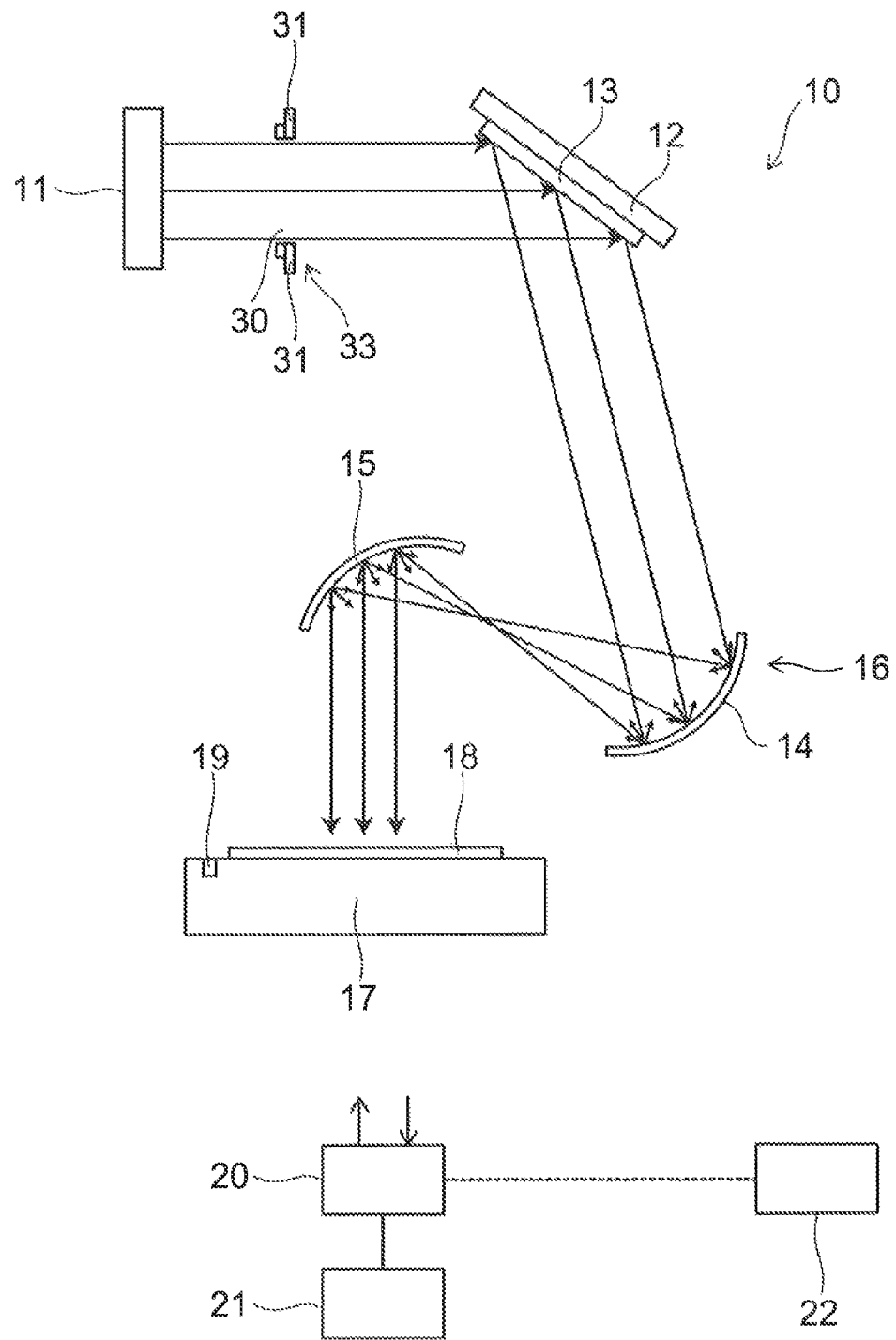
FIG. 1 is a schematic view of an exposure apparatus of an embodiment.

FIG. 1 is a schematic view of an exposure apparatus 10 of the embodiment.

The exposure apparatus 10 of the embodiment is an EUV exposure apparatus using EUV light of a wavelength of 13.5 nm as a light source 11. The exposure apparatus 10 includes the light source 11, a light amount adjustment mechanism 33, a reticle stage 12, a reflective optical system 16, a wafer stage 17, a control device 20, and a memory device 21.

A reticle 13 is held by the reticle stage 12; and a wafer 18 is held by the wafer stage 17. The pattern to be transferred onto the wafer 18 is formed in the reticle 13. The reticle 13 is a reflective photomask.

The light amount adjustment mechanism 33 is provided between the light source 11 and the reticle 13. The light amount adjustment mechanism 33 includes an exposure slit 30 and light-shielding blades 31.

Figure 2A:
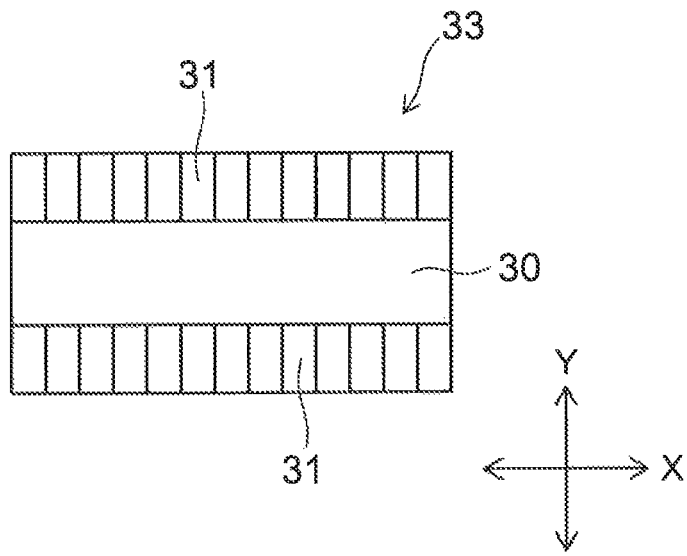
FIGS. 2A and 2B are schematic plan views of a light amount adjustment mechanism of the exposure apparatus in the embodiment.

FIG. 2A is a schematic plan view of the light amount adjustment mechanism 33.

The exposure slit 30 is made in a rectangular configuration; the longitudinal direction of the exposure slit 30 is taken as an X direction; and a direction (the lateral direction of the exposure slit 30) orthogonal to the X direction is taken as a Y direction. The EUV light from the light source 11 passes through the exposure slit 30 to be irradiated toward the reticle 13.

The multiple light-shielding blades 31 are provided proximally to two lateral-direction (Y-direction) end portions of the exposure slit 30. The multiple light-shielding blades 31 are arranged along the longitudinal direction (the X direction) of the exposure slit 30. Each of the light-shielding blades 31 is formed in a rectangular plate configuration such that its longitudinal direction is in the Y direction.

Figure 2B:
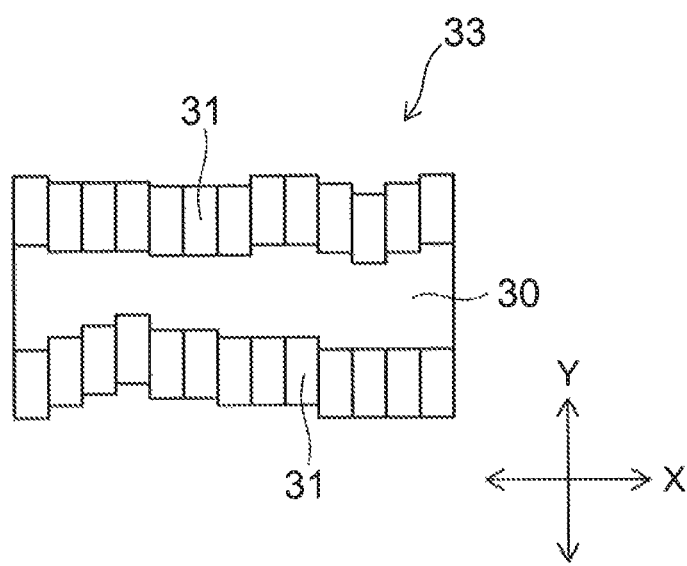

Each of the light-shielding blades 31 is drivable in the Y direction by a not-shown actuator. As shown in FIG. 2B, the surface area (the configuration) of the exposure slit 30 can be changed by driving the light-shielding blades 31 in the Y direction. Accordingly, the light irradiation amount of the EUV light onto the reticle 13 can be adjusted by the driving of the light-shielding blades 31.

The reflective optical system 16 is provided between the reticle 13 and the wafer 18 as a projection optical system that projects the EUV light reflected by the reticle 13 onto the wafer 18. The reflective optical system 16 includes multiple mirrors 14 and 15.

The EUV light emitted from the light source 11 passes through the exposure slit 30 to be irradiated onto the reticle 13 and reflected by the reticle 13. The EUV light reflected by the reticle 13 is irradiated by way of the reflective optical system 16 toward the pattern formation surface of the wafer 18. An illuminance sensor 19 that measures the illuminance distribution of the EUV light on the wafer 18 is provided in the wafer stage 17.

The exposure apparatus 10 of the embodiment uses a scanning exposure method in which the EUV light from the light source 11 is irradiated onto the wafer 18 via the exposure slit 30, the reticle 13, and the reflective optical system 16 while simultaneously moving the reticle stage 12 and the wafer stage 17 relative to the exposure slit 30 in the lateral direction (the Y direction) of the exposure slit 30.

The control device 20 executes the processing shown in FIG. 3 described below and controls the driving of the light-shielding blades 31.

The illuminance distribution on the wafer 18 of the EUV light irradiated onto the wafer 18 can be actually measured by the illuminance sensor 19 provided in the wafer stage 17. However, the measurement of the illuminance distribution of the EUV light on the reticle 13 is difficult. Because of the effect of the flare of the reflective optical system 16, the illuminance distribution on the reticle 13 cannot be determined by a simple linear relation from the illuminance distribution on the wafer 18.

Therefore, according to the embodiment, a mapping between the illuminance distribution on the wafer 18 and the illuminance distribution on the reticle 13 is provided using the relational expression of Formula (1).

$$u_w = u_r * p = \int u_r(x-\tau) \cdot p(\tau) d\tau \tag{1}$$

In Formula (1), p is the point spread function (PSF) reflecting the effect of the flare as a characteristic of the reflective optical system 16. The point spread function p is determined as follows.

Figure 4:
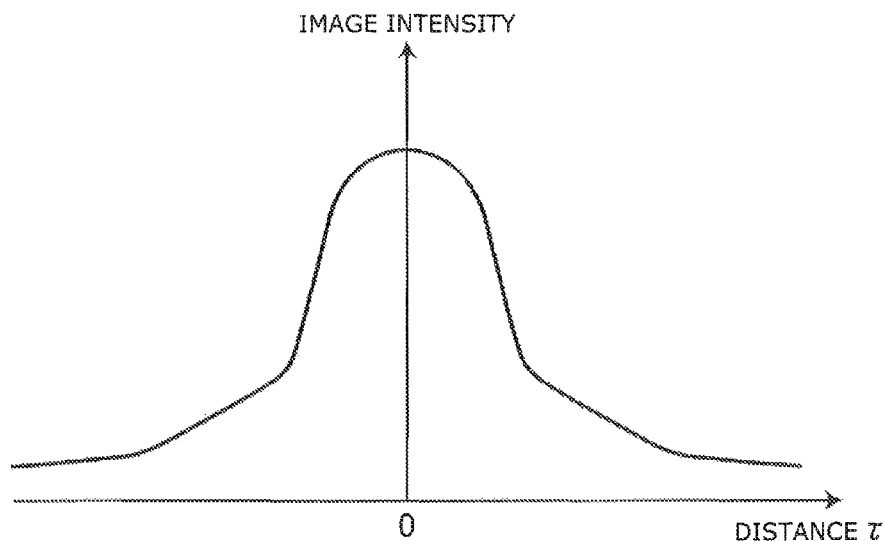
FIG. 4 is a point spread chart reflecting a characteristic of a projection optical system of the exposure apparatus according to the embodiment.

The configurations of the reflective surfaces of the mirrors 14 and 15 included in the reflective optical system 16 are measured; and a ray-tracing calculation of the surface configurations that are measured is performed by assuming a point light source. Then, instead of a point image being formed on the wafer 18 which is the focal point, a spread function such as that shown in FIG. 4 is formed due to the optical path difference. In FIG. 4, the horizontal axis is a distance (a spread of the image) $\tau$ on the wafer 18.

In Formula (1), $u_w$ is the illuminance distribution on the wafer 18; and $u_r$ is the illuminance distribution on the reticle 13. Here, $u_w$ and $u_r$ are expressed as functions of a position x in the longitudinal direction (the X direction) of the exposure slit 30.

Formula (1) is a relational expression of a correlation between the illuminance distribution $u_r$ on the reticle 13, the point spread function p reflecting the characteristic (the effect of the flare) of the reflective optical system 16, and the illuminance distribution $u_w$ on the wafer 18; and $u_r * p$ is the convolution (the product-sum operation) of $u_r$ and p.

The interval of integration is equal to the width of the exposure slit 30 in the longitudinal direction (the X direction) shown in FIG. 2A. For example, the interval of integration is from −b to b in the case where the width of the exposure slit 30 in the longitudinal direction is 2b. The point spread function p may be predicted data from the surface precision (flatness) data of the reflective surfaces of the mirrors 14 and 15 measured beforehand; or data of the point spread function of FIG. 4 that is actually measured may be used. In the embodiment, the predicted data is used.

From the relational expression of Formula (1), it is possible to computationally determine the nature of the illuminance distribution $u_w$ on the wafer 18 that has been affected by the flare due to the reflective optical system 16 in the case where the illuminance distribution $u_r$ on the reticle 13 is adjusted to be uniform.

If the illuminance distribution $u_w$ on the wafer 18 when the illuminance distribution $u_r$ on the reticle 13 is uniform can be calculated, the illuminance distribution $u_r$ on the reticle 13, which cannot be actually measured, can be evaluated indirectly by comparing the calculated value of the calculation to the actual measured value of the illuminance distribution on the wafer 18.

Figure 3:
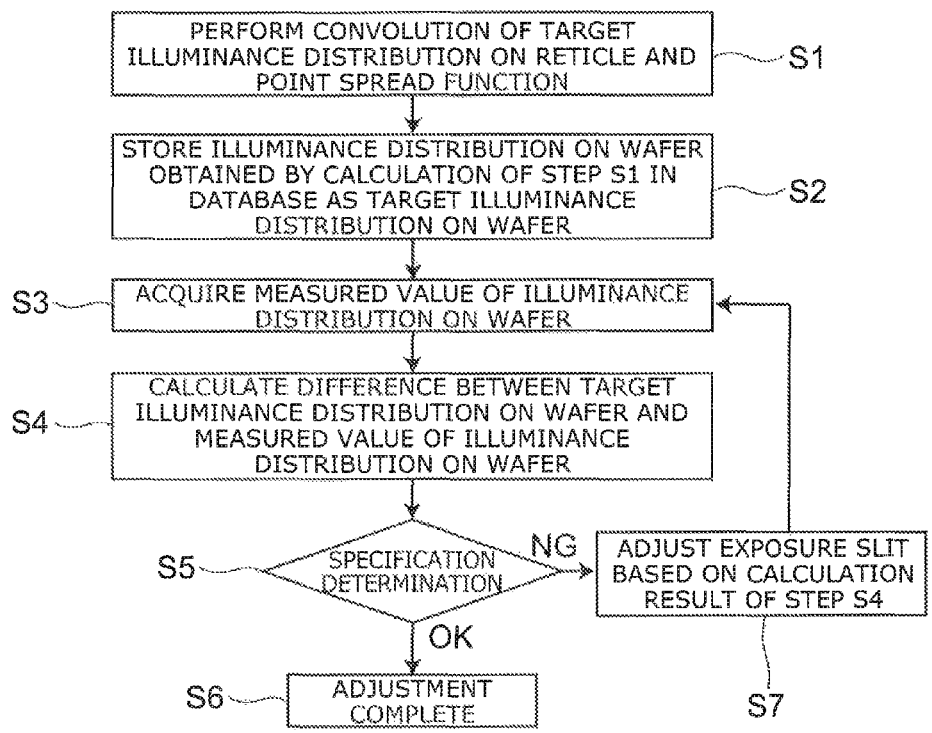
FIG. 3 is a flowchart of a method for controlling the exposure apparatus according to a first embodiment.

FIG. 3 is a flowchart of a method for controlling the exposure apparatus 10 according to the first embodiment.

The series of processing described below is executed based on the commands of a control program of the exposure apparatus according to the embodiment stored in the memory device 21 shown in FIG. 1 that is read by the control device 20.

First, as step S1, the convolution of a target illuminance distribution $u_r$ target on the reticle 13 and the point spread function p reflecting the characteristic (the effect of the flare) of the reflective optical system 16 is performed according to Formula (1).

The illuminance distribution on the wafer 18 reflecting the effect of the flare when the illuminance distribution on the reticle 13 is the target illuminance distribution is calculated by the convolution. It can be evaluated indirectly whether or not the illuminance distribution on the reticle 13, which cannot be actually measured, is the target illuminance distribution $u_r$_target by comparing the difference between the actual measured value of the illuminance distribution on the wafer 18 and a target illuminance distribution $u_w$_target on the wafer 18 obtained by the calculation.

Figure 5:
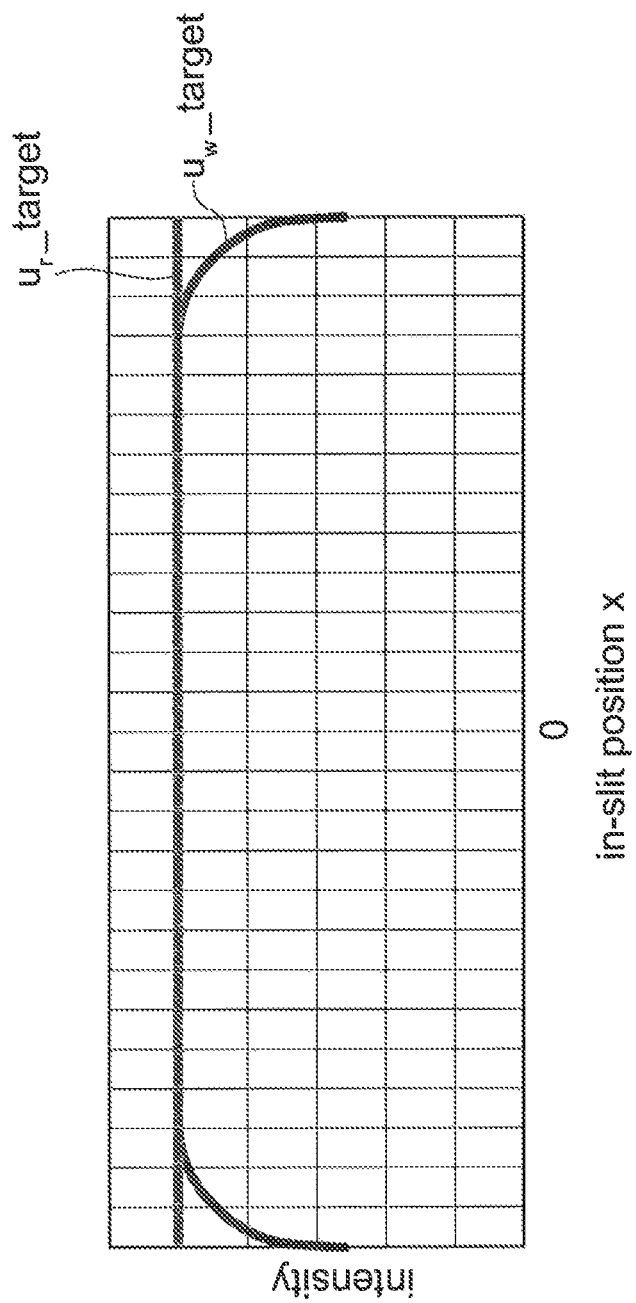
FIG. 5 is a chart showing a target illuminance distribution on a reticle and a target illuminance distribution on a wafer in the method for controlling the exposure apparatus according to the first embodiment.

FIG. 5 shows the target illuminance distribution $u_r$_target on the reticle 13 and the target illuminance distribution $u_w$_target on the wafer 18 that corresponds to the target illuminance distribution $u_r$_target. In FIG. 5, the horizontal axis is the position x in the longitudinal direction (the X direction) of the exposure slit 30; and 0 illustrates the X-direction center position of the exposure slit 30.

In the first embodiment, the target illuminance distribution $u_r$_target on the reticle 13 is a uniform illuminance distribution. In the case of the uniform illuminance distribution on the reticle 13, the illuminance distribution on the wafer 18 is not uniform due to the effect of the flare of the reflective optical system 16 and is an illuminance distribution in which the illuminance relatively decreases at the two longitudinal-direction ends of the exposure slit 30 as in $u_w$_target shown in FIG. 5.

As step S2, the calculation result of step S1 recited above is stored beforehand in a database of the memory device 21 shown in FIG. 1 which is included in the exposure apparatus 10. Or, the calculation result recited above may be stored in an external memory device 22 that is capable of communicating with the exposure apparatus 10.

Then, as step S3, a measured value $u_w$_measure of the illuminance distribution on the wafer 18 is acquired using the illuminance sensor 19. The measured value $u_w$_measure of the illuminance distribution on the wafer 18 is stored in the memory device 21.

Figure 6:
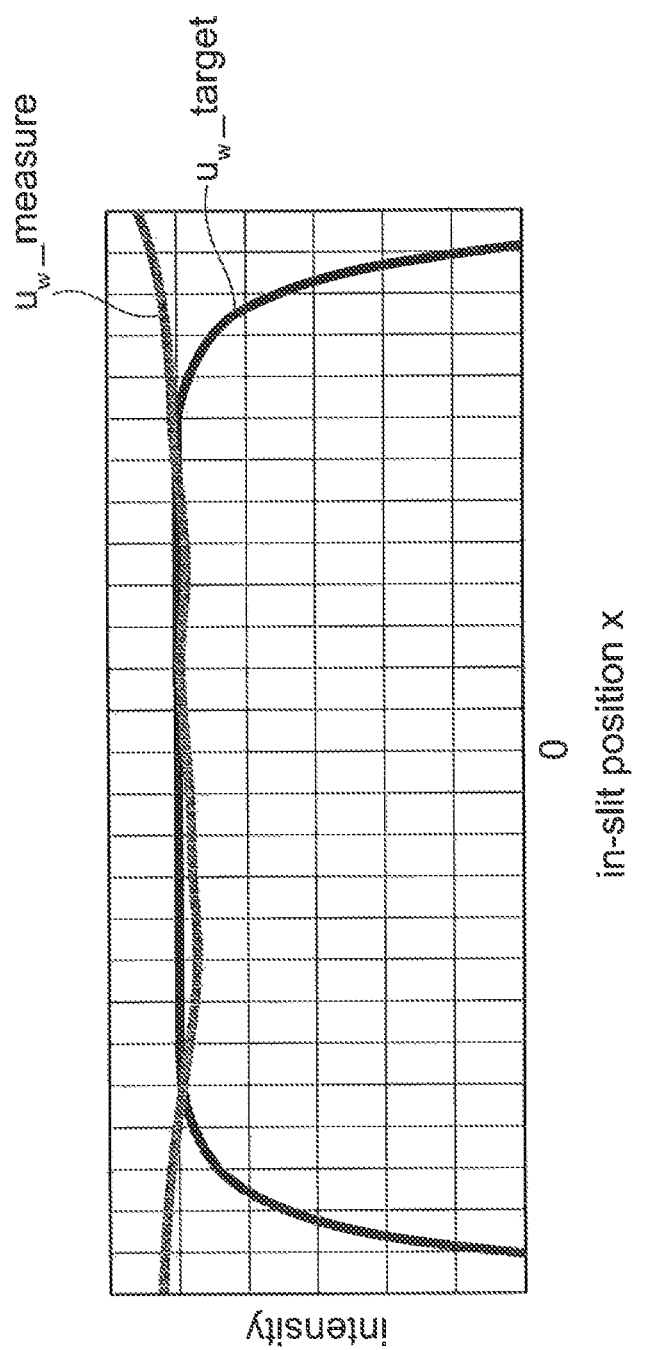
FIG. 6 is a chart showing a measured value of the illuminance distribution on the wafer and the target illuminance distribution on the wafer in the method for controlling the exposure apparatus according to the first embodiment.

FIG. 6 shows the measured value $u_w$_measure of the illuminance distribution on the wafer 18 and the target illuminance distribution $u_w$_target on the wafer 18. In FIG. 6, the horizontal axis is the position x in the longitudinal direction (the X direction) of the exposure slit 30; and 0 illustrates the X-direction center position of the exposure slit 30.

Then, as step S4, the difference between the measured value $u_w$_measure of the illuminance distribution on the wafer 18 and the target illuminance distribution $u_w$_target on the wafer 18 is calculated. Namely, the shift of the illuminance distribution $u_r$ on the reticle 13 from the target illuminance distribution $u_r$_target when the illuminance distribution on the wafer 18 is $u_w$_measure is calculated indirectly.

Continuing, as step S5, a determination is performed of whether or not the difference between $u_w$_target and $u_w$_measure calculated in step S4, that is, the shift of the illuminance distribution $u_r$ on the reticle 13 from the target illuminance distribution $u_r$_target, is within a specification (a tolerance range) that is set.

If the specification determination is OK, the flow proceeds to step S6; and the adjustment of the illuminance distribution on the reticle 13 is completed.

As step S7, in the case where the specification determination recited above is not OK, the surface area of the exposure slit 30 is adjusted based on the difference obtained in the calculation of step S4 by calculating the drive control amount of the light-shielding blades 31 shown in FIGS. 2A and 2B and driving the light-shielding blades 31 according to the drive control amount.

Then, the EUV light is irradiated through the adjusted exposure slit 30 onto the reticle 13; and the reflected light of the reticle 13 is projected onto the wafer 18 via the reflective optical system 16. Continuing, the illuminance distribution on the wafer 18 at this time is measured. In other words, the flow returns to step S3. Then, as the next step S4, the difference between the measured value $u_w$_measure of the illuminance distribution on the wafer 18 and the target illuminance distribution uw_target on the wafer 18 obtained in the calculation of step S1 is calculated; and the difference is evaluated in step S5.

The illuminance distribution on the reticle 13 can be adjusted to be uniform by repeating the processing recited above until the specification determination of step S5 becomes OK. Accordingly, according to the embodiment, the control of the illuminance distribution on the reticle 13 is performed with high precision considering the effect of the flare. The evaluation and adjustment of the illuminance distribution on the reticle 13 are performed, for example, as a regular check of the exposure apparatus 10.

The target illuminance distribution $u_r$_target on the reticle 13 is not limited to being a uniform distribution. According to the embodiment, it is possible to perform the adjustment to any illuminance distribution on the reticle. Although corrections of other components to reduce the fluctuation of the pattern size transferred onto the wafer 18 are ultimately performed, there are many cases where it is necessary for the illuminance distribution on the reticle 13 to be uniform as the premise to perform the corrections easily and with high precision.

According to the first embodiment illustrated by the flowchart of FIG. 3, the illuminance distribution on the reticle 13 can be adjusted indirectly to become the target distribution (the uniform distribution) from the comparison between the actual measured value $u_w$_measure and the target illuminance distribution $u_w$_target on the wafer 18 that is preset based on Formula (1). However, it is also possible to directly evaluate the illuminance distribution on the reticle 13 by determining the illuminance distribution on the reticle 13 computationally from Formula (1) and the measured value $u_w$_measure of the illuminance distribution on the wafer 18.

A method for directly evaluating the illuminance distribution on the reticle 13 by determining the illuminance distribution on the reticle 13 computationally from Formula (1) and the measured value $u_w$_measure of the illuminance distribution on the wafer 18 will now be described as a method for controlling the exposure apparatus 10 according to a second embodiment.

Figure 7:
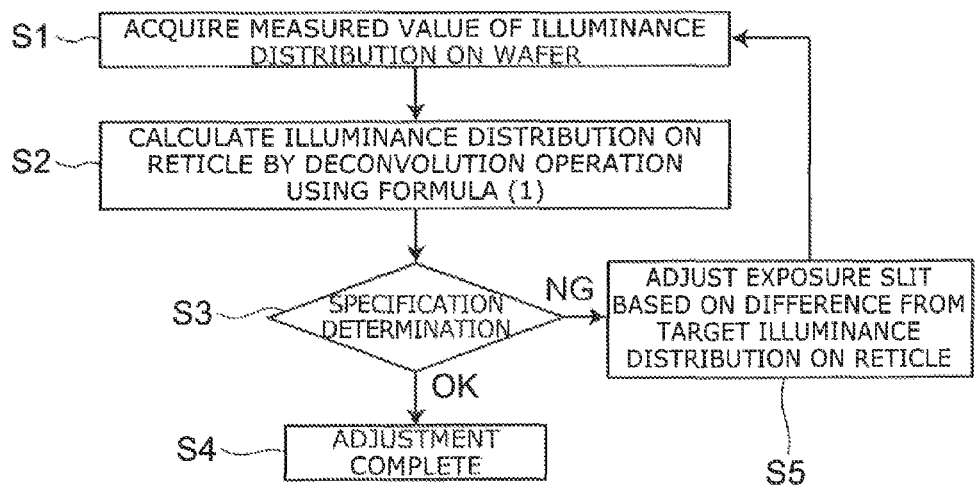
FIG. 7 is a flowchart of a method for controlling the exposure apparatus according to a second embodiment.

FIG. 7 is a flowchart of the method.

The series of processing of the second embodiment described below also is executed based on the commands of a control program of the exposure apparatus stored in the memory device 21 shown in FIG. 1 that is read by the control device 20.

First, as step S1, the measured value $u_w$_measure of the illuminance distribution on the wafer 18 is acquired using the illuminance sensor 19. The measured value $u_w$_measure of the illuminance distribution on the wafer 18 is stored in the memory device 21.

Then, as step S2, the illuminance distribution on the reticle 13 is calculated from the measured value $u_w$_measure of the illuminance distribution on the wafer 18 by performing the deconvolution operation of Formula (1) recited above.

Figure 8:
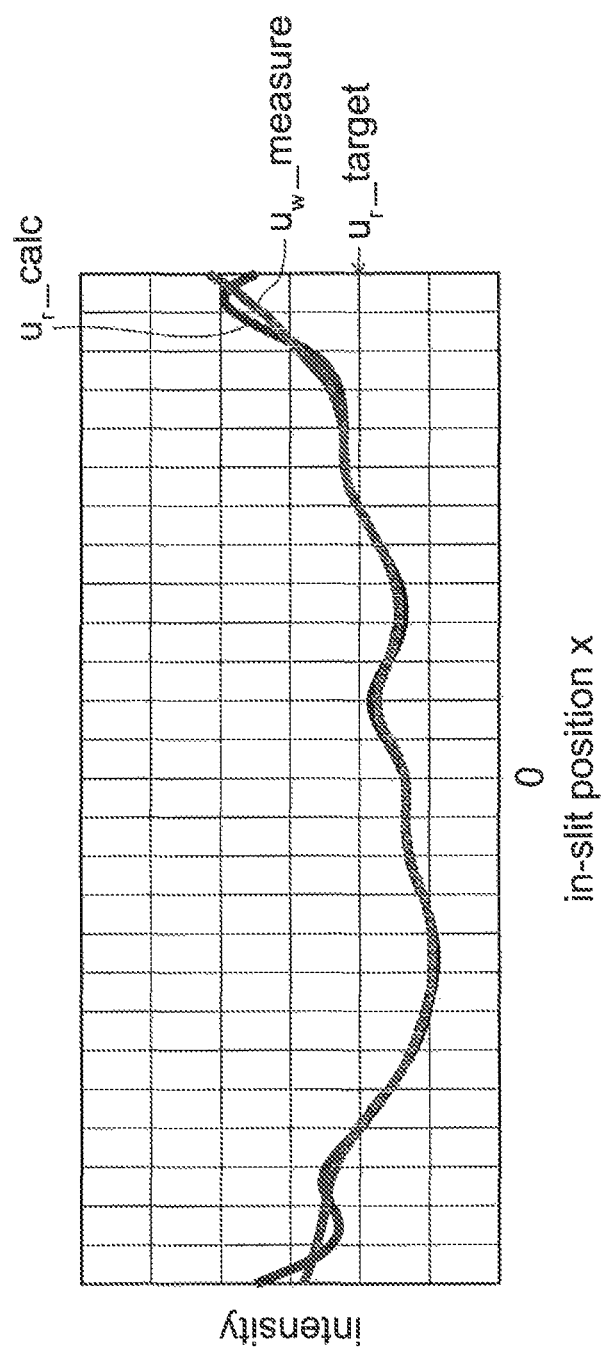
FIG. 8 is a chart showing a measured value of the illuminance distribution on the wafer and an illuminance distribution on the reticle calculated from the measured value in the method for controlling the exposure apparatus according to the second embodiment.

FIG. 8 shows the measured value $u_w$_measure of the illuminance distribution on the wafer 18 and an illuminance distribution $u_r$_calc on the reticle 13 obtained by the deconvolution operation of step S2. In FIG. 8, the horizontal axis is the position x in the longitudinal direction (the X direction) of the exposure slit 30; and 0 illustrates the X-direction center position of the exposure slit 30.

Then, as step S3, the illuminance distribution $u_r$_calc on the reticle 13 obtained in step S2 can be evaluated directly. Namely, the determination is performed of whether or not the shift of the illuminance distribution $u_r$_calc from the target illuminance distribution $u_{r\_target}$ is within the specification (the tolerance range) that is set.

If the specification determination is OK, the flow proceeds to step S4; and the adjustment of the illuminance distribution on the reticle 13 is completed.

As step S5, in the case where the specification determination recited above is not OK, the surface area of the exposure slit 30 is adjusted based on the difference between the illuminance distribution $u_{r\_calc}$ and the target illuminance distribution $u_{r\_target}$ by calculating the drive control amount of the light-shielding blades 31 shown in FIGS. 2A and 2B and driving the light-shielding blades 31 according to the drive control amount.

Then, the EUV light is irradiated through the adjusted exposure slit 30 onto the reticle 13; and the reflected light of the reticle 13 is projected onto the wafer 18 via the reflective optical system 16. Continuing, the illuminance distribution $u_{w\_measure}$ on the wafer 18 at this time is measured. In other words, the flow returns to step S1. Then, step S2 and step S3 are repeated; and the illuminance distribution $u_{r\_calc}$ on the reticle 13 is evaluated.

The illuminance distribution on the reticle 13 can be adjusted to be the target distribution (e.g., the uniform distribution) by repeating the processing recited above until the specification determination of step S3 becomes OK.

Specifically, a Fourier transform is performed to determine the illuminance distribution $u_r$ on the reticle 13 from Formula (1). Instead of direct calculation of the convolution, the calculation amount can be greatly reduced by performing the Fourier transform, performing multiplication, and then performing the inverse operation of the Fourier transform (the inverse Fourier transform).

The illuminance distribution $u_w$ on the wafer 18 can be represented by Formula (1) recited above, where the illuminance distribution on the reticle 13 is $u_r$, and the point spread function reflecting the effect of the flare as the characteristic of the reflective optical system 16 is p.

Here, assuming that the inverse Fourier function of $u_w$ exists, $u_r$ can be represented by Formula (2) using $u_w$ and ci.

$$u_r = u_w * c_i = \int u_w(x-\tau) \cdot c_i(\tau) d\tau \quad (2)$$

For example, causing the illuminance distribution $u_r$ on the reticle 13 to be uniform is equivalent to minimizing $u_r$. Accordingly, in the case where the illuminance distribution $u_r$ on the reticle 13 is caused to be uniform, ci is the optimal correction value to minimize $u_r$ of Formula (2). In other words, the surface area of the exposure slit 30 is adjusted by driving the light-shielding blades 31 shown in FIGS. 2A and 2B to minimize $u_r$ of Formula (2).

Although the deconvolution operation of Formula (1) is performed using the Fourier transform in the specific example recited above, in the case where the inverse Fourier function does not exist, it is possible to calculate the illuminance distribution on the reticle 13 by the repeated calculations described below with reference to FIGS. 9A to 9E.

First, as shown in FIG. 9A, an appropriate illuminance distribution is set as the illuminance distribution on the reticle 13.

Then, according to Formula (1), the convolution is performed for the illuminance distribution of the reticle 13 that is set in FIG. 9A and the point spread function p shown in FIG. 9B reflecting the effect of the flare of the reflective optical system 16.

The calculated value of the illuminance distribution on the wafer 18 obtained by the convolution is illustrated by the solid line in FIG. 9C. The broken line of FIG. 9C illustrates the measured value of the illuminance distribution on the wafer 18 measured using the illuminance sensor 19.

Then, the difference between the calculated value of the illuminance distribution on the wafer 18 and the measured value of the illuminance distribution on the wafer 18 is evaluated; and in the case where the difference is not within the specification (the tolerance range), the illuminance distribution on the reticle 13 is corrected based on the difference as illustrated by the solid line in FIG. 9D. The broken line in FIG. 9D illustrates the illuminance distribution on the reticle 13 that is set in FIG. 9A prior to the correction.

Then, again, the convolution is performed according to Formula (1) for the illuminance distribution on the reticle 13 that is corrected in FIG. 9D and the point spread function p shown in FIG. 9E.

Continuing, the difference between the calculated value of the illuminance distribution on the wafer 18 obtained in the convolution and the measured value (the broken line of FIG. 9C) of the illuminance distribution on the wafer 18 is evaluated. The processing described above is repeated until the difference is within the specification (the tolerance range).

By the processing described above, the set value (the predicted distribution) of the illuminance distribution on the reticle 13 is corrected using Formula (1) to reduce the difference between the calculated value of the illuminance distribution on the wafer 18 calculated by the convolution according to Formula (1) and the measured value of the illuminance distribution on the wafer 18. As a result, if such an actual measured value of the illuminance distribution is obtained on the wafer 18, it can be reckoned that the illuminance distribution on the reticle 13 has such an illuminance distribution.

If the illuminance distribution on the reticle 13 can be determined, it is possible to adjust the illuminance distribution on the reticle 13 to be the target distribution by adjusting the surface area of the exposure slit 30 based on the illuminance distribution on the reticle 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for controlling an exposure slit of an exposure apparatus, comprising:
    calculating a shift from a target value of an illuminance distribution on a reticle of light irradiated onto the reticle, the calculating being based on a relational expression and a measured value of an illuminance distribution on a wafer of light irradiated onto the wafer via a projection optical system, the relational expression having a correlation between the illuminance distribution on the reticle, the illuminance distribution on the wafer, and a spread function reflecting a characteristic of the projection optical system projecting light obtained by way of the reticle onto the wafer, wherein
    the illuminance distribution of the light on the wafer in the relational expression is expressed as a convolution of the illuminance distribution of the light on the reticle and the spread function, and the interval of integration of the convolution is a width in a longitudinal direction of the exposure slit configured to pass the light from a light source toward the reticle.

2. The method according to claim 1, wherein the light is EUV (Extreme Ultra Violet) light.

3. The method according to claim 2, wherein the projection optical system is a reflective optical system configured to project the EUV light reflected by the reticle onto the wafer.

4. The method according to claim 3, wherein the spread function is a point spread function reflecting an effect of flare as the characteristic of the reflective optical system.

5. The method according to claim 3, wherein
the reflective optical system includes a mirror, and
the spread function is predicted from surface precision data of a reflective surface of the mirror.

6. The method according to claim 3, wherein
the reflective optical system includes a mirror, and
the spread function is obtained from a ray-tracing calculation for a configuration of a reflective surface of the mirror assuming a point light source.

7. The method according to claim 1, wherein the illuminance distribution of the light on the reticle is calculated from the measured value of the illuminance distribution of the light on the wafer by a deconvolution operation of the relational expression.

8. The method according to claim 1, wherein the exposure apparatus includes the projection optical system that projects light through the exposure slit.

9. The method according to claim 1, further comprising:
measuring the measured value of an illuminance distribution on a wafer of light irradiated onto the wafer via the projection optical system using a sensor.

10. The method according to claim 9, further comprising:
adjusting a surface area of the exposure slit relative to the calculated shift.

11. A method for controlling an exposure apparatus, comprising:
calculating a shift from a target value of an illuminance distribution on a reticle of light irradiated onto a reticle, the calculating being based on a relational expression and a measured value of an illuminance distribution on a wafer of light irradiated onto the wafer via a projection optical system, the relational expression having a correlation between the illuminance distribution on the reticle, the illuminance distribution on the wafer, and a spread function reflecting a characteristic of the projection optical system projecting light obtained by way of the reticle onto the wafer, wherein
a target illuminance distribution on the wafer corresponding to a target illuminance distribution on the reticle is calculated from the relational expression,
the target illuminance distribution on the wafer is compared to the measured value of the illuminance distribution on the wafer,
a determination is performed of whether or not a difference between the target illuminance distribution on the wafer and the measured value of the illuminance distribution on the wafer is within a specification that is set, and
a surface area of an exposure slit is adjusted in the case where the difference is not within the specification, the exposure slit being configured to pass the light from a light source toward the reticle.

12. The method according to claim 11, wherein the target illuminance distribution on the reticle is a uniform illuminance distribution.

13. The method according to claim 11, wherein a determination is performed of whether or not a difference between the target illuminance distribution on the wafer and the measured value of the illuminance distribution on the wafer is within a specification that is set.

14. The method according to claim 13, wherein a surface area of an exposure slit is adjusted in the case where the difference is not within the specification, the exposure slit being configured to pass the light from a light source toward the reticle.

15. An exposure apparatus, comprising:
a light amount adjustment mechanism configured to adjust a surface area of a slit through which light passes from a light source toward a reticle;
a projection optical system configured to project light passing through the slit onto a wafer by way of the reticle; and
a control device configured to calculate a shift from a target value of an illuminance distribution on a reticle of light irradiated onto the reticle, the calculating being based on a relational expression and a measured value of an illuminance distribution on a wafer of light irradiated onto the wafer via the projection optical system, the relational expression having a correlation between the illuminance distribution on the reticle, the illuminance distribution on the wafer, and a spread function reflecting a characteristic of the projection optical system, wherein the illuminance distribution of the light on the wafer in the relational expression is expressed as a convolution of the illuminance distribution of the light on the reticle and the spread function, and
the interval of integration of the convolution is a width in a longitudinal direction of the slit through which light passes the light from the light source toward the reticle.

16. The apparatus according to claim 15, wherein the light is EUV (Extreme Ultra Violet) light.

17. The apparatus according to claim 16, wherein the projection optical system is a reflective optical system configured to project the EUV light reflected by the reticle onto the wafer.

18. The apparatus according to claim 15, further comprising an illuminance sensor configured to measure the illuminance distribution of the light on the wafer.

* * * * *